(12) United States Patent
Pedoeem et al.

(10) Patent No.: US 11,683,907 B2
(45) Date of Patent: *Jun. 20, 2023

(54) APPARATUS FOR COOLING ELECTRONIC CIRCUITRY

(71) Applicant: Crestron Electronics, Inc., Rockleigh, NJ (US)

(72) Inventors: Albert Pedoeem, West Orange, NJ (US); Kriss Replogle, Brookside, NJ (US); Sanjay Upasani, Manalapan, NJ (US); Don Florczak, Tenafly, NJ (US)

(73) Assignee: Crestron Electronics, Inc., Rockleigh, NJ (US)

(*) Notice: Subject to any disclaimer, the term of this patent is extended or adjusted under 35 U.S.C. 154(b) by 197 days.

This patent is subject to a terminal disclaimer.

(21) Appl. No.: 17/375,045

(22) Filed: Jul. 14, 2021

(65) Prior Publication Data

US 2021/0345521 A1  Nov. 4, 2021

Related U.S. Application Data

(63) Continuation of application No. 16/534,398, filed on Aug. 7, 2019, now Pat. No. 11,076,501, and a continuation-in-part of application No. 15/602,334, filed on May 23, 2017, now abandoned.

(51) Int. Cl.
  *H05K 7/20* (2006.01)
(52) U.S. Cl.
  CPC ..... *H05K 7/20154* (2013.01); *H05K 7/20145* (2013.01); *H05K 7/20445* (2013.01)
(58) Field of Classification Search
  CPC ........... H05K 7/20136; H05K 7/20154; H05K 7/20172; H05K 7/20145; H05K 7/205

USPC ................ 361/679.48, 679.46, 690; 454/184
See application file for complete search history.

(56) References Cited

U.S. PATENT DOCUMENTS

| | | | | |
|---|---|---|---|---|
| 4,062,273 A | * | 12/1977 | O'Connor | B61D 27/009 454/105 |
| 5,564,980 A | * | 10/1996 | Becker | F24F 7/08 454/252 |
| 5,694,294 A | * | 12/1997 | Ohashi | G06F 1/203 361/679.48 |
| 6,310,771 B1 | | 10/2001 | Chien | |
| 6,458,028 B2 | * | 10/2002 | Snyder | F04D 25/088 454/292 |
| 7,525,799 B2 | * | 4/2009 | Lai | H05K 7/20572 361/695 |

(Continued)

*Primary Examiner* — Ko-Wei Lin
(74) *Attorney, Agent, or Firm* — Crestron Electronics, Inc.

(57) ABSTRACT

An apparatus cools electronic circuitry. An enclosure surrounds the electronic circuitry and has plural surfaces. Air intake holes are disposed in at least one surface and face at least one first direction. Air exhaust holes are disposed in at least another surface and face at least one second direction different than the first direction. A heat sink is in thermal contact with the circuitry and conducts heat generated by the circuitry. When a fan operates, air is drawn from an exterior of the enclosure through the air intake holes, absorbs heat from the heat sink, and then is directed through the air exhaust holes into the exterior of the enclosure. The heat sink is further in thermal contact with the enclosure so that when the fan does not operate, heat is drawn from the circuitry to the enclosure via the heat sink and is dissipated from the exterior.

8 Claims, 9 Drawing Sheets

(56) References Cited

U.S. PATENT DOCUMENTS

| | | | | |
|---|---|---|---|---|
| 7,643,293 B2* | 1/2010 | Chu | | F28D 15/0275 |
| | | | | 361/679.48 |
| 7,869,212 B2* | 1/2011 | Kong | | H01L 23/467 |
| | | | | 361/679.48 |
| 8,462,505 B2* | 6/2013 | Nagami | | B23K 9/1006 |
| | | | | 219/133 |
| 8,570,742 B2* | 10/2013 | Yeh | | G06F 1/20 |
| | | | | 361/679.48 |
| 8,634,193 B2* | 1/2014 | Zhou | | H05K 7/20127 |
| | | | | 361/679.48 |
| 8,964,374 B1* | 2/2015 | Sheng | | H05K 7/20836 |
| | | | | 361/679.49 |
| 8,988,878 B2* | 3/2015 | Lin | | G06F 1/203 |
| | | | | 361/679.48 |
| 9,170,615 B2* | 10/2015 | Wilke | | H05K 7/20727 |
| 9,557,785 B2* | 1/2017 | Lin | | G06F 1/20 |
| 9,764,347 B2* | 9/2017 | Nudelman | | B05B 16/60 |
| 2008/0232063 A1* | 9/2008 | Koo | | G06F 1/203 |
| | | | | 361/679.48 |
| 2009/0103265 A1* | 4/2009 | Hongo | | G06F 1/203 |
| | | | | 361/690 |
| 2012/0020014 A1* | 1/2012 | Chang | | H05K 7/20727 |
| | | | | 361/679.48 |
| 2012/0100795 A1* | 4/2012 | Ishimine | | F24F 13/0227 |
| | | | | 165/104.34 |
| 2012/0121487 A1* | 5/2012 | Jewell-Larsen | | H01L 23/467 |
| | | | | 422/171 |
| 2012/0129442 A1* | 5/2012 | Wei | | H05K 7/1497 |
| | | | | 454/184 |
| 2012/0276834 A1* | 11/2012 | Peng | | H05K 7/20745 |
| | | | | 454/184 |
| 2012/0318756 A1* | 12/2012 | Elwany | | H05K 7/18 |
| | | | | 211/26 |
| 2013/0045671 A1* | 2/2013 | Apple | | F24F 11/0001 |
| | | | | 454/239 |
| 2013/0050942 A1* | 2/2013 | Konishi | | H05K 7/20127 |
| | | | | 361/692 |
| 2014/0235156 A1* | 8/2014 | Li | | H05K 7/20154 |
| | | | | 454/184 |
| 2014/0362529 A1* | 12/2014 | Tsuchida | | H05K 7/20127 |
| | | | | 361/690 |
| 2015/0017905 A1* | 1/2015 | Li | | H05K 7/20163 |
| | | | | 454/184 |
| 2015/0065029 A1* | 3/2015 | Leckelt | | F24F 11/0001 |
| | | | | 454/184 |
| 2015/0109733 A1* | 4/2015 | Horiuchi | | H05K 7/20136 |
| | | | | 361/695 |
| 2015/0156917 A1* | 6/2015 | Ogawa | | H05K 7/20136 |
| | | | | 361/695 |
| 2015/0195952 A1* | 7/2015 | Tsunoda | | G06F 1/203 |
| | | | | 361/690 |
| 2016/0088760 A1* | 3/2016 | Yukito | | H05K 7/20136 |
| | | | | 361/679.48 |
| 2016/0106000 A1* | 4/2016 | Tang-Kong | | F28F 3/048 |
| | | | | 165/80.3 |
| 2016/0124473 A1* | 5/2016 | Lin | | H05K 7/20136 |
| | | | | 361/679.49 |
| 2016/0143180 A1* | 5/2016 | Zhu | | H05K 7/20572 |
| | | | | 165/80.2 |
| 2016/0269099 A1* | 9/2016 | Auricchio, Jr. | | H04B 7/18515 |
| 2016/0302327 A1* | 10/2016 | Dangy-Caye | | H05K 7/20127 |
| 2017/0083058 A1* | 3/2017 | Janak | | G06F 1/20 |
| 2017/0155984 A1* | 6/2017 | Ting | | H04R 1/2811 |
| 2017/0185113 A1* | 6/2017 | Wang | | F28F 13/003 |
| 2018/0298921 A1* | 10/2018 | Niemann | | F28F 3/04 |

* cited by examiner

FIG. 1

VIEW A-A

FIG. 2A

VIEW B-B

APPARATUS FOR COOLING ELECTRONIC CIRCUITRY

CROSS-REFERENCE TO RELATED APPLICATIONS

This application is a continuation of U.S. patent application Ser. No. 16/534,398, filed Aug. 7, 2019, which is a continuation-in-part of U.S. patent application Ser. No. 15/602,334, filed May 23, 2017, the disclosures of which are incorporated herein by reference. The present application further claims the benefit of the filing date of U.S. Provisional Patent Application No. 62/345,169, filed Jun. 3, 2016, the disclosure of which is incorporated herein by reference.

BACKGROUND OF THE INVENTION

Technical Field

Aspects of the embodiments relate generally to rack mounted equipment housings, and more specifically to systems, methods, and modes for cooling of circuitry located within rack mounted equipment housings that substantially eliminates or prevents problems associated with currently available technology.

Background Art

As those of skill in the art of the design, manufacture, and sale of electronic equipment can no doubt appreciate, fans are sometimes necessary to cool integrated circuits, such as those use in transmitters and receivers sold in Digital Media (DM) products manufactured by Crestron Electronics, Inc., of Rockleigh, N.J., due to their high thermal dissipation levels. Typically, fans are located either to the side of the high wattage device, or right above the high wattage device in order to cool the device effectively, or at least to try and cool the device effectively. A typical installation places the vent holes in the container housing (housing) right above the fan. This approach introduces several drawbacks: If the vent holes are blocked during installation, this will result in overheating the equipment. This is a likely scenario when equipment is installed behind the display. In addition, placing the fan right behind the vent holes causes high acoustic noise. Further, the fan may be visible from outside of the housing, detracting from the aesthetic appearance of the device.

Accordingly, a need has arisen for systems, methods, and modes for cooling of circuitry located within rack mounted equipment housings that substantially eliminates or prevents problems associated with currently available technology.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. It is to be understood that both the general and detailed descriptions that follow are exemplary and explanatory only and are not restrictive.

DISCLOSURE OF INVENTION

In accordance with an aspect, an apparatus for cooling electronic circuitry comprises an enclosure configured to surround the electronic circuitry, the enclosure having a plurality of surfaces, wherein a plurality of air intake holes are disposed in at least one of the plurality of surfaces and face at least one first direction, and a plurality of air exhaust holes are disposed in at least another one of the plurality of surfaces and face at least one second direction that is a different direction than the first direction; a heat sink configured to be in thermal contact with the electronic circuitry and conduct heat generated by the electronic circuitry; and a fan arranged such that when the fan operates, air is drawn from an exterior of the enclosure through the plurality of air intake holes, absorbs heat from the heat sink, and then is directed through the plurality of air exhaust holes into the exterior of the enclosure; the heat sink being further configured to be in thermal contact with the enclosure so that when the fan does not operate, heat is drawn from the circuitry to the enclosure via the heat sink and is dissipated from the exterior of the enclosure.

According to a further aspect, an apparatus for cooling electronic circuitry comprises an enclosure configured to surround the electronic circuitry, the enclosure having a plurality of surfaces, wherein a plurality of air intake holes are disposed in at least one of the plurality of surfaces, and a plurality of air exhaust holes are disposed in at least another one of the plurality of surfaces; an air plenum piece disposed within the enclosure and configured to divide an interior region of the enclosure into a first volume into which the air intake holes open and a second volume into which the air exhaust holes open, the air plenum piece having an air plenum hole that forms an opening between the first volume and the second volume; a fan located in coaxial alignment with the air plenum hole such that when the fan operates, air is drawn from an exterior of the enclosure through the plurality of air intake holes into the first volume, then through the air plenum hole into the second volume, and thereafter from the second volume through the plurality of air exhaust holes into the exterior of the enclosure; and a heat sink configured to be in thermal contact with both the electronic circuitry and with the enclosure so that when the fan does not operate, heat is drawn from the circuitry to the enclosure via the heat sink and is dissipated from the exterior of the enclosure.

According to another aspect, an apparatus for cooling electronic circuitry comprises an enclosure configured to surround the electronic circuitry, the enclosure including: a first portion configured to support a circuit board having the electronic circuitry and having a first surface, a second portion having a second surface disposed opposite the first surface, and a plurality of side surfaces disposed between the first surface and the second surface, wherein a plurality of air intake holes are disposed in at least the second surface, and a plurality of air exhaust holes are disposed in at least one of the plurality of side surfaces; an air plenum piece that includes a substantially planar portion that is disposed between the first and second surfaces, the substantially planar portion being configured to divide an interior region of the enclosure into a first volume into which the air intake holes open and a second volume into which the air exhaust holes open, and having an air plenum hole that forms an opening between the first volume and the second volume; a heat sink having a lower portion that is disposed in the second volume between the circuit board and the air plenum piece, the lower portion having a bottom surface that is in thermal contact with the circuitry and having a top surface, and a fan disposed atop the heat sink and in coaxial alignment with the air plenum hole such that when the fan operates, cooling air is drawn from an exterior of the enclosure through the plurality of air intake holes into the first volume, then from the first volume into the second volume, and thereafter from the second volume through the plurality of air exhaust holes into the exterior of the enclosure in a direction other than from a direction from which the cooling air is drawn, the movement of the cooling air in the second volume drawing heat away from the heat sink; the heat sink having at least one vertical portion that extends at one end from the lower portion of the heat sink, and then alongside part a region of the substantially planar portion of the air plenum piece, and the heat sink having at least one upper portion disposed at another end of the at least one vertical portion, the at least one upper portion being in thermal contact with the enclosure so that when the fan does not operate, heat is drawn from the circuitry to the enclosure via the heat sink and is dissipated into the exterior of the enclosure.

BRIEF DESCRIPTION OF DRAWINGS

The accompanying figures further illustrate the present embodiments.

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the present embodiments. In the drawings, like reference numerals designate corresponding parts throughout the several views.

BRIEF DESCRIPTION OF THE SEVERAL VIEWS OF THE DRAWING

DETAILED DESCRIPTION OF THE INVENTION

The embodiments are described more fully hereinafter with reference to the accompanying drawings, in which aspects of the embodiments are shown. In the drawings, the size and relative sizes of layers and regions may be exaggerated for clarity. Like numbers refer to like elements throughout. The embodiments may, however, be embodied in many different forms and should not be construed as limited to the aspects of the embodiments set forth herein. Rather, these embodiments are provided so that this disclosure will be thorough and complete, and will fully convey the scope of the aspects of the embodiments to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as audio electronic devices.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" on "in an embodiment" in various places throughout the specification is not necessarily referring to the same embodiment. Further, the particular feature, structures, or characteristics may be combined in any suitable manner in one or more embodiments.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

LIST OF REFERENCE NUMBERS FOR THE MAJOR ELEMENTS IN THE DRAWING

The following is a list of the major elements in the drawings in numerical order.
100 Electronic Circuity Cooling Apparatus (Cooling Apparatus)
102 Lower Portion
104 Circuit Board with Cooling Fan (Circuit Board)
106 Air Plenum Piece (APP)
108 Upper Portion
202 Cooler Intake Air
204 Warmer Output Air
302 Rear Air Inlet
304 Rear Panel
306 Bottom Panel
402 Fan
404 Heat Sink 406 Circuitry
502 Air Plenum Hole (Hole)
504 Horizontal Surface
506 Vertical Wall
508 Plenum Planar Portion
510 Plenum Air Channel
512 Assembly Holes
602 Top Air Inlet
604 Front Air Inlet
606 Side Air Exhaust
608 Assembly Screws
610 Front Panel
612 Left Side Panel
614 Right Side Panel
616 Upper Panel
700 Electronic Circuity Cooling Apparatus (Cooling Apparatus)
702 Lower Portion
704 Circuit Board
706 Heat Sink with Cooling Fan (Heat Sink)
708 Air Plenum Piece (APP)
710 Upper Portion
802 Rear Air Inlet
804 Rear Panel
806 Bottom Panel
902 Circuit Board Surface
904 Circuitry
906 Heat Sink Footprint
1002 Fan
1004 Lower Horizontal Portion
1006 Vertical Wall
1008 Upper Horizontal Portion
1010 Pin Array
1102 Air Plenum Hole (Hole)
1106 Vertical Wall
1108 Plenum Planar Portion
1110 Plenum Air Channel
1202 Top Air Inlet
1204 Front Air Inlet
1206 Side Air Exhaust
1208 Assembly Screws
1210 Front Panel
1212 Left Side Panel
1214 Right Side Panel
1216 Upper Panel

LIST OF ACRONYMS USED IN THE SPECIFICATION IN ALPHABETICAL ORDER

The following is a list of the acronyms used in the specification in alphabetical order.
APP Air Plenum Piece

MODE(S) FOR CARRYING OUT THE INVENTION

The different aspects of the embodiments described herein pertain to the context of a cooling system for audio electronics, but is not limited thereto, except as may be set forth expressly in the appended claims.

For 40 years Creston Electronics Inc., has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein, as embodied as digital media products such as DM-TX-4K-1000-SFP (4K transmitter) and DM-RX-4K-1000-SFP (4K receiver), can be manufactured by Crestron Electronics Inc., located in Rockleigh, N.J., and have been marketed and sold under the registered trademark name of "DigitalMedia."

Figure 1:
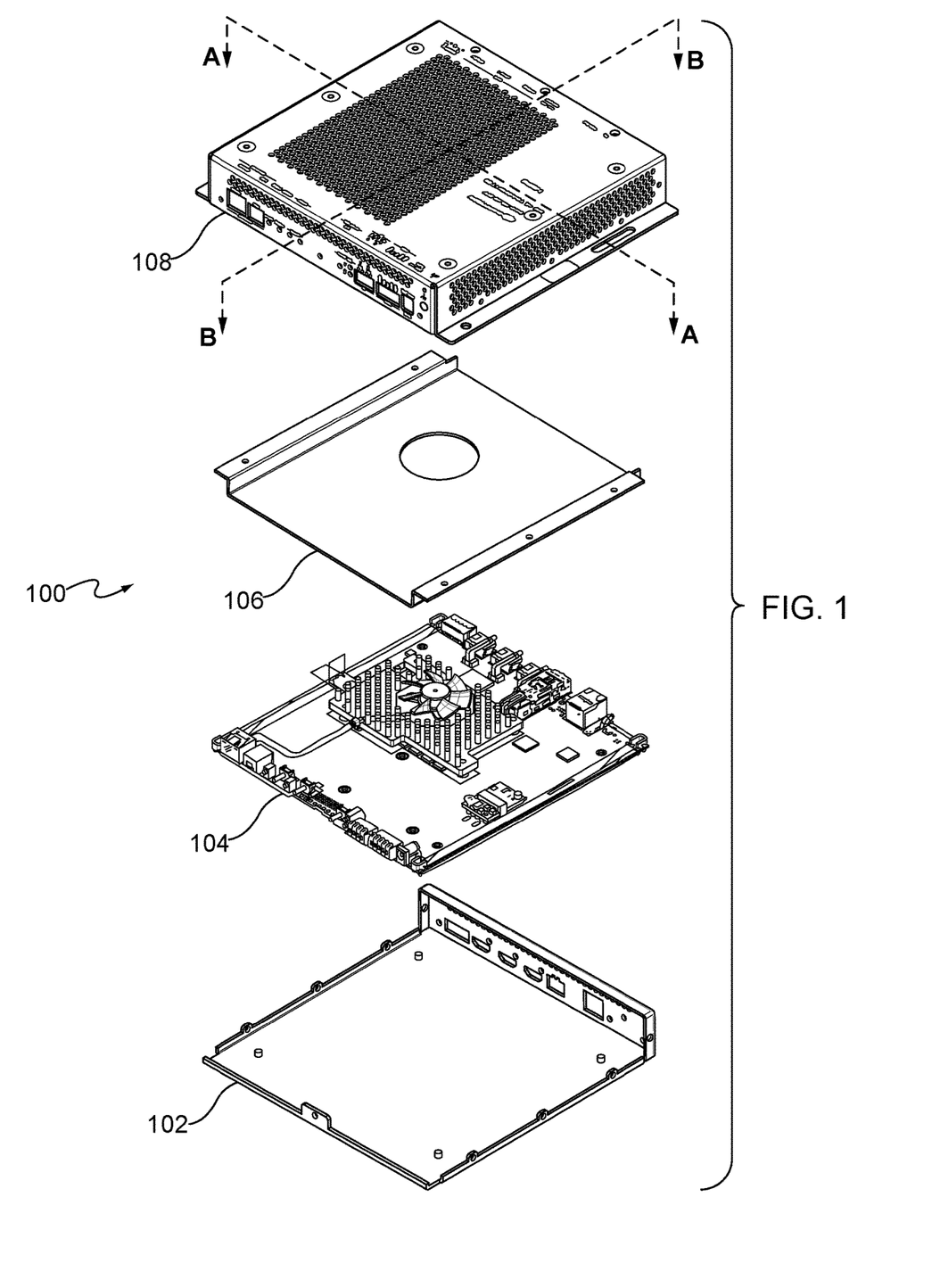
FIG. 1 illustrates an exploded perspective view of a housing of electronic circuitry in which a cooling apparatus has been implemented according to aspects of the embodiments.
Figure 2A:
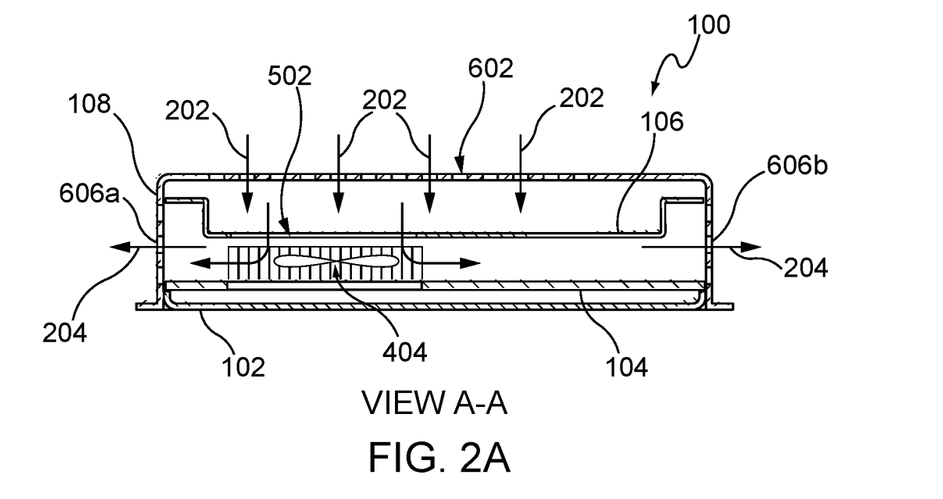
FIG. 2A illustrates a sectional view along lines A-A of FIG. 1 of the cooling apparatus according to aspects of the embodiments.
Figure 2B:
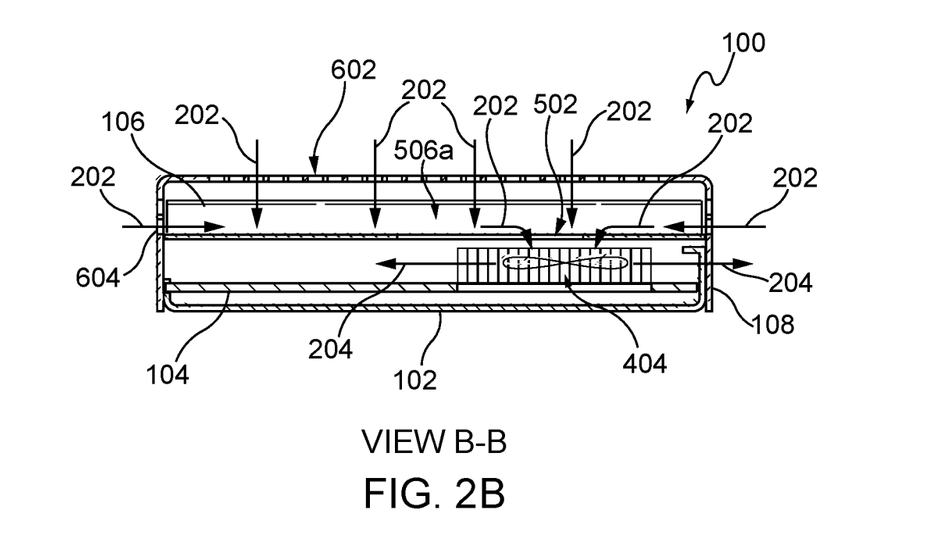
FIG. 2B illustrates a sectional view along lines B-B of FIG. 1 of the cooling apparatus according to aspects of the embodiments.

FIG. 1 illustrates an exploded perspective view of a housing of electronic circuitry in which a cooling apparatus has been implemented according to aspects of the embodiments. According to aspects of the embodiments, components of cooling apparatus 100 include both extraneous components, and the manner in which they have been implemented in design, but also intrinsic components, such as components of the housing assembly itself. This combination of devices will be described in greater detail below.

Electronic circuitry cooling apparatus (cooling apparatus) 100 comprises lower portion 102, circuit board with cooling fan (circuit board) 104, air plenum piece (APP) 106, and upper portion 108.

Figure 3:
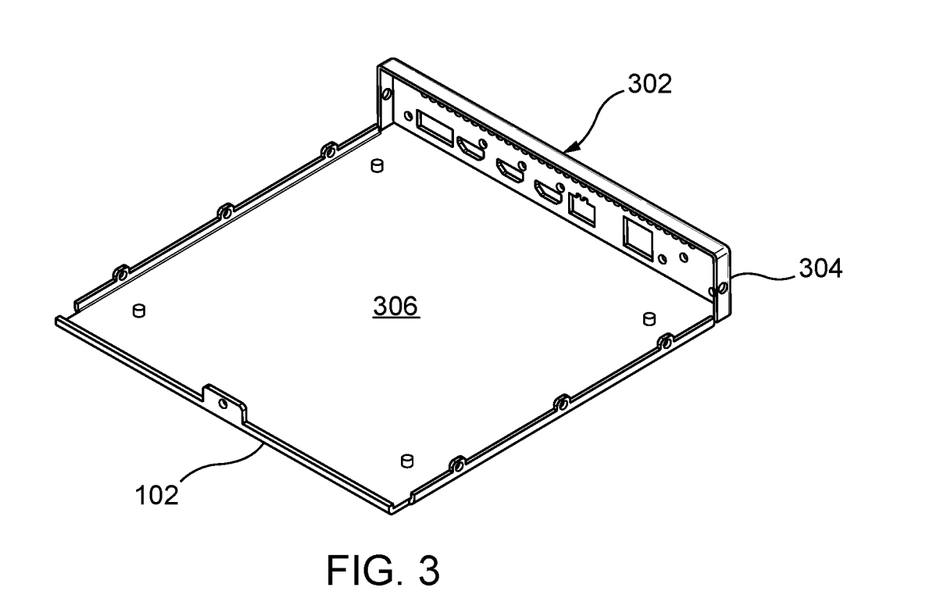
FIG. 3 illustrates a perspective view of a bottom portion of the cooling apparatus of FIGS. 1 and 2 according to aspects of the embodiments.

As shown in FIG. 3, which illustrates a perspective view of bottom portion 102 of cooling apparatus 100, lower portion 102 comprises rear air inlet 302, which is located on rear panel 304, and further comprises bottom panel 306 according to aspects of the embodiments.

Figure 4:
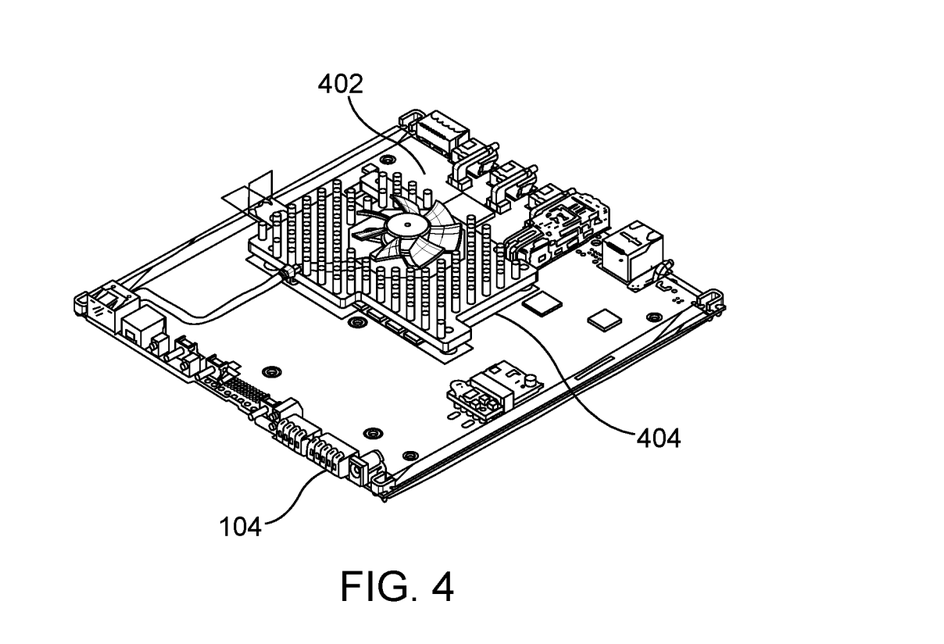
FIG. 4 illustrates a perspective view of an electronic printed circuit board with a cooling fan mounted thereupon according to aspects of the embodiments.

Shown in FIG. 4 is circuit board 104, which itself comprises cooling fan 402 located on top of heat sink 404 and circuitry 406, which is configured and arranged in a manner well known to those of skill in the art, and thus, in fulfillment of the dual purposes of clarity and brevity, a detailed discussion thereof has been omitted from herein.

Figure 5A:
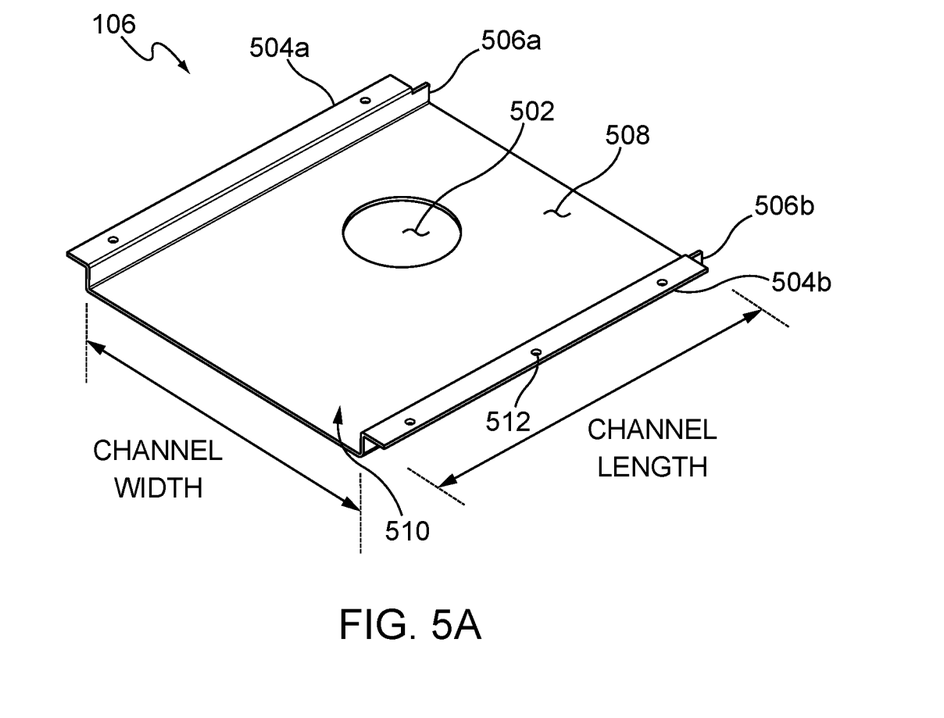
FIG. 5A illustrates a perspective view of an air plenum piece used in the cooling apparatus of FIGS. 1 and 2 according to aspects of the embodiments.

FIG. 5A illustrates air plenum piece 106, which comprises plenum planar portion 508, vertical tabs 506a,b, horizontal tabs 504a,b, and air plenum hole 502, located on plenum planar portion 508. In addition, air plenum piece 106 further comprises a plurality of mounting holes 512. air plenum piece 106 is adapted and shaped in the form of an elongated channel, and as such comprises channel 510 that includes a channel width and a channel length according to aspects of the embodiments.

Figure 6:
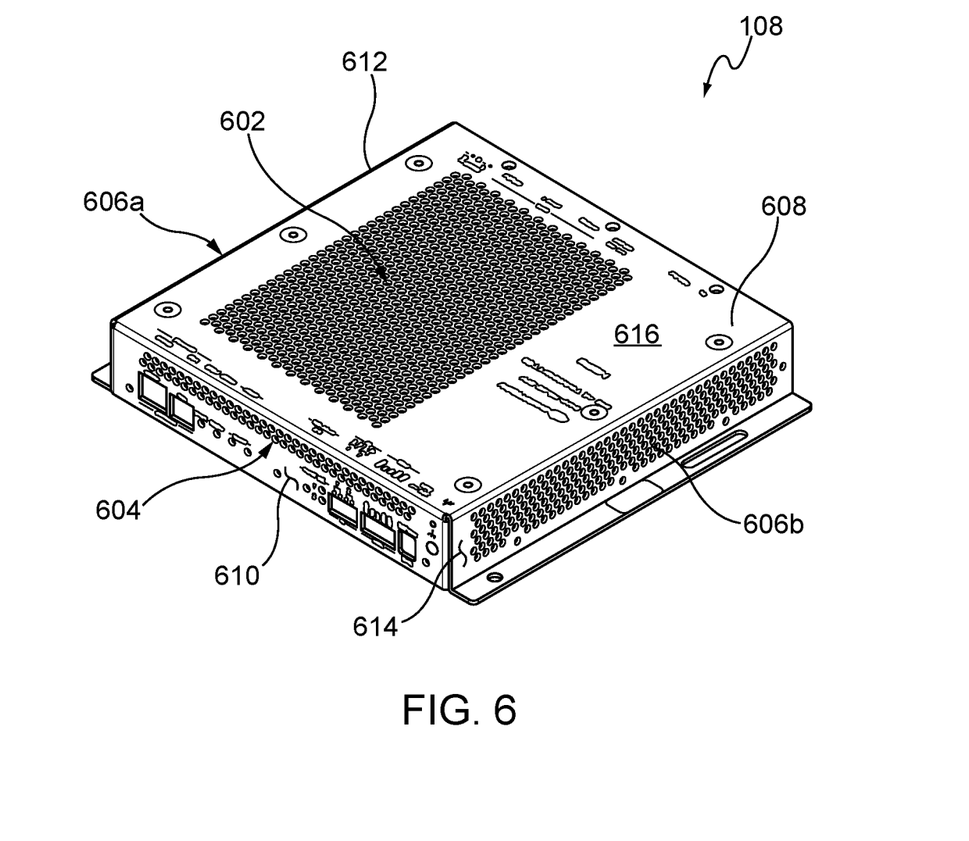
FIG. 6 illustrates a perspective view of an upper portion of the cooling apparatus of FIGS. 1 and 2 according to aspects of the embodiments.

FIG. 6 illustrates upper portion 108, which comprises front panel 610, left side panel 612, right side panel 614, and upper panel 616. In addition, front panel 610 comprises front air inlets 604, left side panel 612 comprises side air exhaust 606a, and right side panel 614 comprises side air exhaust 606b according to aspects of the embodiments. Further, top portion 616 comprises top air inlet 602 according to aspects of the embodiments.

Described in several of the drawings are the nomenclatures that indicate relative position of "front," "rear," "side," "top," "bottom," and other such similar indicators of relative position. As those of skill in the art can appreciate, such indicators are not to be taken in a limiting sense, and are merely provided to make the discussion and description of the aspects of the embodiments spatially easier to understand, and to place pieces or components thereof in spatial or relative context with each other.

Attention is now directed to FIGS. 1, 2A, 2B, 5A, 5B, and 6. According to aspects of the embodiments, cooler intake air (intake air) 202 is drawn in from top air inlet 602, front air inlet 604, and rear air inlet 302 by operation of fan 402. As intake air 202 is drawn in, it is forced to travel on top of air plenum piece 106, because, as shown in FIGS. 1, 2A, 2B, and 5A, air plenum piece 106 has been designed and fabricated to substantially enclose the air intakes, separate them from the lower portion of the housing enclosure, and provide only one path for intake air 202 to travel as it is pulled in by fan 402; that is, air plenum piece 106 substantially seals the upper portion of the interior of the housing from the lower portion (anything below air plenum piece 106), which includes circuit board 104 and the upper surface of lower portion 102. Further, since all air intake holes (302, 602, 604) are located in that space that is defined by the upper level of air plenum piece 106 and the interior lower surface of upper portion 108, intake air 202 travels through channel 510 to hole 502 and fan 402, via operation of fan 402.

Intake air 202 is pulled through rear air inlet 302, top air inlet 602, and front air inlet 604, and then through hole 502 by fan 402, wherein it passes over and through heat sink 404 and circuitry 406 located on circuit board 104. As the air is expelled from fan 402 and passes over heat sink 404 and circuitry 406, it picks up heat, and becomes or transitions to warmer output air (output air) 204. Output air 204 is forced to be expelled through side air exhausts 606*a,b* according to aspects of the embodiments, as they are the only exhausts available for the warmer air to travel according to aspects of the embodiments.

According to aspects of the embodiments, air duct conduit system (cooling apparatus) 100 has been created such that air can be ducted to fan 402 from multiple air inlets 302, 602, 604. Air exhaust vents 606*a,b* are located on the left and right side walls 612, 614, respectively. Having a plurality of surfaces with inlets 302, 602, 604 substantially prevents the possibility of over-heating due to blocked air inlets according to aspects of the embodiments. Air plenum piece 106 contains a suitably sized hole 502 that is about the size of the diameter of the fan blades, and is spaced in close proximity to the fan blades. In addition, air plenum piece 106 is sized and located such that it leaves a very small gap between air plenum piece 106 and the front and rear walls, so that air is drawn from the top surface 616, and front and rear walls 610, 304 according to aspects of the embodiments. According to further aspects of the embodiments, air plenum piece 106 of this configuration also reduces the amount of fan noise radiated from the container because the fan is located farther away from the exterior surface, and the intake air has a longer distance to travel prior to encountering the blades of fan 402; as those of skill in the art can appreciate, air intakes that are located relatively closer to the blades of a fan create more noise than when air intakes are located relatively farther away from the blades of the fan. Further, cooler intake air 202 is pulled in from multiple and larger 602, 604, 302 surfaces that further reduces the acoustic noise generated by the fan as those skilled in the art can appreciate. According to still further aspects of the embodiments, locating fan 402 farther away from inlets 302, 602, 604 lowers the pressure drop through the same inlets 302, 602, 604, which can be increased to accommodate greater cooling capacity; thus, more heat can be removed with a smaller fan than would otherwise be the case.

Figure 5B:
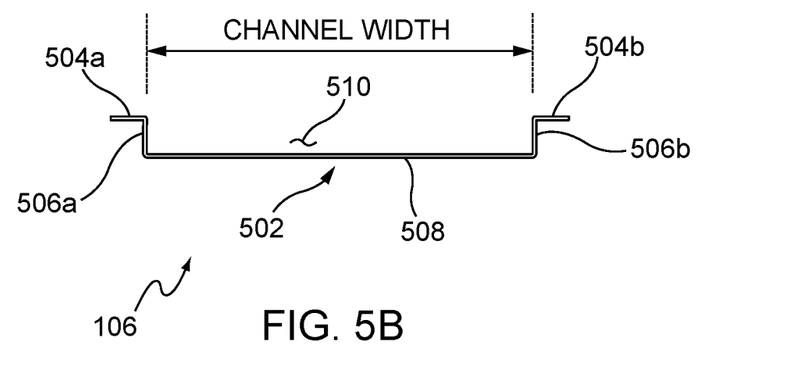
FIG. 5B illustrates a side view of the air plenum piece used in the cooling apparatus of FIGS. 1 and 2 according to aspects of the embodiments.

Attention is again directed to FIG. 5A, which illustrates a perspective view of air plenum piece 106 used in cooling apparatus 100 of FIGS. 1 and 2 according to aspects of the embodiments, and FIG. 5B, which illustrates a side view of air plenum piece 106 used in the cooling apparatus of FIGS. 1 and 2 according to aspects of the embodiments. As shown in FIGS. 5A and 5B, air plenum piece 106 comprises a substantially planar portion (plenum planar portion) 508, within which is located hole 502. Hole 502 is sized to be substantially similar in diameter to the diameter of the blades of fan 402, which, according to aspects of the embodiments, is located substantially coaxially in alignment with hole 502 (e.g., an imaginary line drawn through the center of hole 502 and the center of the fan blades would be substantially parallel and co-located in space and perpendicular to fan 402 and hole 502). On both sides of plenum planar portion 508 are located respective substantially vertical walls (walls) 506*a,b*, which form plenum air channel 510.

Plenum air channel 510 is the three dimensional space through which intake air 202 travels to get to hole 502 and fan 402. Plenum air channel 510 is formed not only by walls 506*a,b*, but also by rear panel 304 (FIG. 3; of lower portion 102) and front panel 610 (FIG. 6; of upper portion 108), according to aspects of the embodiments. According to aspects of the embodiments, it is the creation of plenum air channel 510 that causes the cool intake air 202 to be drawn into hole 502 by fan 402. As shown in FIGS. 5A and 5B, channel 510 has a length and width; due to the design and fabrication thereof, the channel length is approximately the interior linear distance from front panel 610 to rear panel 304 according to aspects of the embodiments. The channel width is the linear distance between first vertical wall 506*a* and second vertical wall 506*b*, as shown in FIG. 5B, according to aspects of the embodiments. The volume of channel 510 is defined by the product of the channel length, channel width, and channel depth (which is the height of vertical walls 506*a,b*), and has been sized to accommodate the amount of air that can be drawn in by fan 402 and required to maintain an adequate rate of cooling (or rate of heat dissipation) of the electronic circuitry located on circuit board 104.

FIG. 6 illustrates a perspective view of upper portion 108 of cooling apparatus 100 of FIGS. 1 and 2 according to aspects of the embodiments. As shown in FIG. 6, upper portion 108 comprises all but one of the sections of air intake and air exhaust holes. Upper portion 108 comprises top air inlet 602 (located on upper panel 616), front air inlet 604 (located on front panel 610), side air exhaust 606*a* (located on left side panel 612), and side air exhaust 606*b* (located on right side panel 614). While rear air inlet 302 is shown as being located on lower portion 102, those of skill in the art can appreciate that upper portion 108 could have been fabricated to encompass all four panels or walls, or the walls/could have been separately fabricated, among other possible combinations of assembly. According to still further aspects of the embodiments, air plenum piece 106 need not have oriented in the manner shown, but could also have had channel 510 cross in a direction perpendicular to that as shown; e.g., channel 510 could have run between left side panel 612 and right side panel 614, as opposed to running between front panel 610 and rear panel 304.

According to further aspects of the embodiments, the relative position and location of the air inlets as not being on a same surface of the air exhausts means that little or no hot exhaust air can be vacuumed into the air inlets; because of this configuration, only ambient air, or at least not hot air from the same enclosure will be pulled in by fan 402 through air inlets so that the cooling benefit of the moving air will be maximized. According to still further aspects of the embodiments, the relatively far distance between the blades of fan 402 and the air inlets means that the acoustical noise generated by the fan will be substantially minimized, and the cooling effectiveness substantially maximized. According to aspects of the embodiments, the height or distance of air plenum piece 106 above fan 402 can be about equal to the diameter of the blades of fan 402 in order to substantially minimize acoustical noise generated by fan 402.

According to additional aspects of the embodiments, the acoustical noise generated by the fan can be further decreased by reducing the rotational speed (number of RPM) of the fan when maximum cooling is not needed but some cooling is still required. As an example, when power to the circuitry is shut off or reduced after normal operation of the circuitry, the circuitry may still require some cooling, though not requiring the same air flow as needed during normal operation. By continuing to operate the fan at a reduced number of RPM, cooling of the circuitry continues for a time and quieter operation is attained.

According to aspects of other embodiments, in place of operating the fan at a reduced RPM, the circuitry is cooled by providing a configuration in which the heat sink is shaped to provide a passive heat conduction path from the circuitry to one or more surfaces of the housing, where the heat dissipates, for example, to the surrounding air. By providing this additional heat conduction path, heat continues to be drawn from the circuitry even after power to the circuitry is reduced or removed, so that the fan may be completely shut down at this time. As a result, fan noise after power down or power reduction is eliminated.

Figure 7:
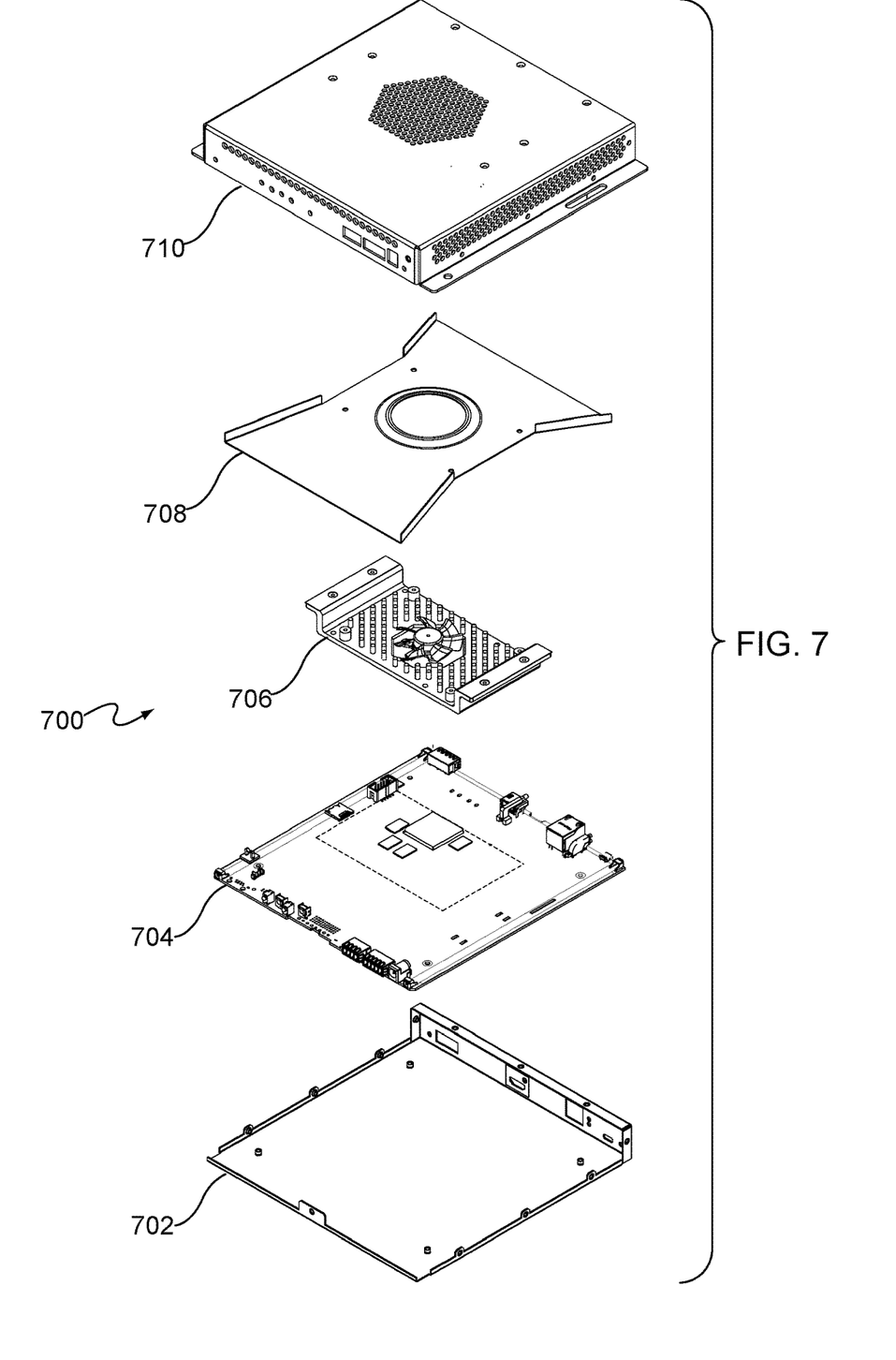
FIG. 7 illustrates an exploded perspective view of a housing of electronic circuitry in which a cooling apparatus has been implemented according to aspects of other embodiments.

FIG. 7 illustrates an exploded perspective view of a housing of electronic circuitry in which a cooling apparatus has been implemented according to aspects of the other embodiments. Electronic circuitry cooling apparatus (cooling apparatus) 700 includes a lower portion 702, a circuit board 704, a heat sink with cooling fan (heat sink) 706, an air plenum piece (APP) 708, and an upper portion 710.

Figure 8:
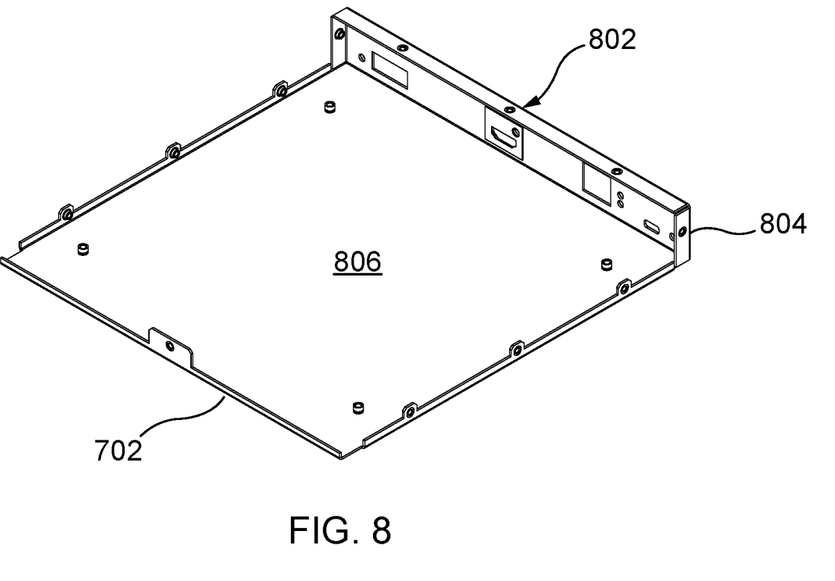
FIG. 8 illustrates a perspective view of a bottom portion of the cooling apparatus of FIG. 7.

Referring now to FIG. 8, a perspective view of the lower portion 702 of the cooling apparatus 700 is shown. The lower portion 702 includes a rear air inlet 802, which is located on a rear panel 804, and a bottom panel 806. The structure and function of the lower portion 702 is similar to that of the lower portion 302 shown in FIGS. 1-3.

Figure 9:
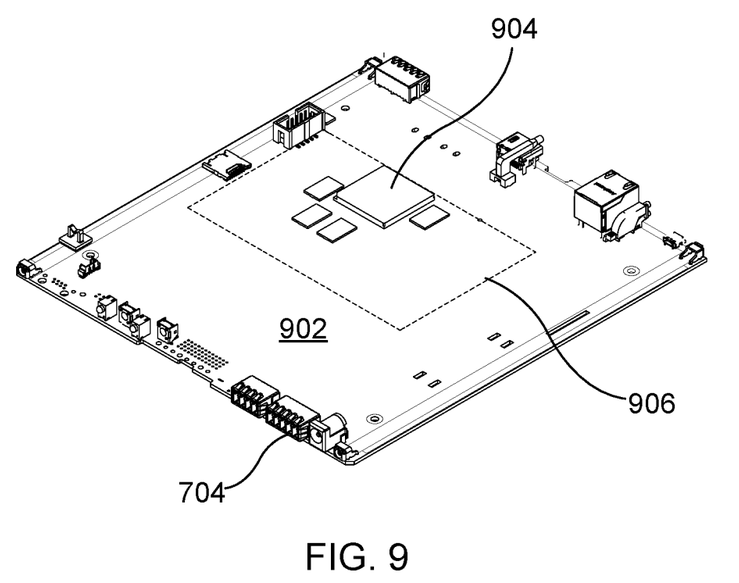
FIG. 9 illustrates a perspective view of an electronic printed circuit board disposed within the cooling apparatus of FIG. 7.

FIG. 9 shows a perspective view of the circuit board 704. The circuit board is typically supported by the lower portion 702. The circuit board includes a circuit board panel 902 upon which are mounted various circuitry 904. Some or all of the circuitry 904, or at least those elements that require cooling, are mounted within a "footprint" of where the heat sink 706 will overlie, depicted in this example by the region enclosed by dashed line 906. The heat sink 706 will be in thermal contact with the circuitry within this region.

Figure 10:
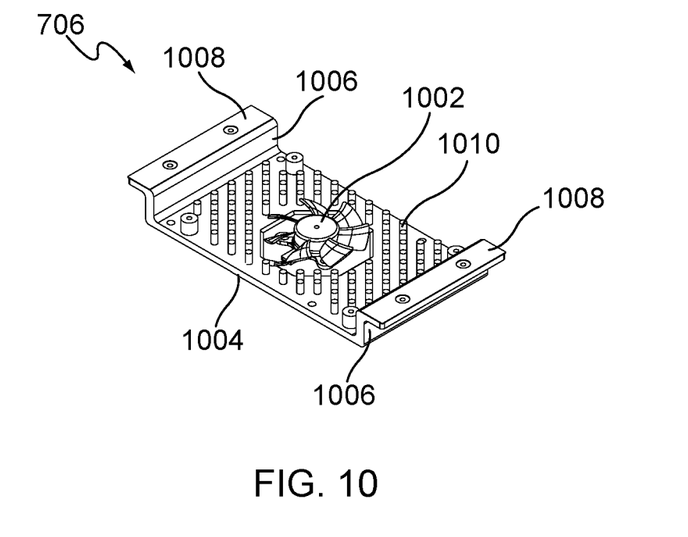
FIG. 10 illustrates a perspective view of a heat sink and cooling fan of the cooling apparatus of FIG. 7.

FIG. 10 depicts a perspective view of the heat sink 706. The heat sink includes a lower horizontal portion 1004 that is disposed atop the circuitry 904. A bottom surface of the lower horizontal portion 1004 is in thermal contact with the circuitry 904 and is configured to draw heat away from the circuitry. An array of pins 1010 is disposed on an opposing surface of the lower horizontal portion 1004 and conducts heat away from the circuitry 904 and from the lower horizontal surface 1004. A cooling fan 1002 is located atop of heat sink 706 and, when operating, draws air over the array of pins 1010 to transfer heat to air circulated by the fan.

The heat sink 706 also includes vertical walls 1006 which are located, for example, at each end of the lower horizontal portion 1004 and which extend at one end from the lower horizontal portion 1004. At an opposing end of each vertical wall 1006 is disposed a raised horizontal portion 1008. The vertical walls 1006 and the raised horizontal portions 1008 provide an alternative path for conducting heat away from the circuitry 904. That is, when the cooling apparatus 700 is assembled, the raised horizontal portions 1008 are in thermal contact with the upper portion 710 and allow heat from the circuitry, for example, to radiate and convect into the surrounding air or to an external heat sink. Thus, when the cooling fan 1002 is not in operation, cooling for the circuitry 904 is still provided.

Figure 11:
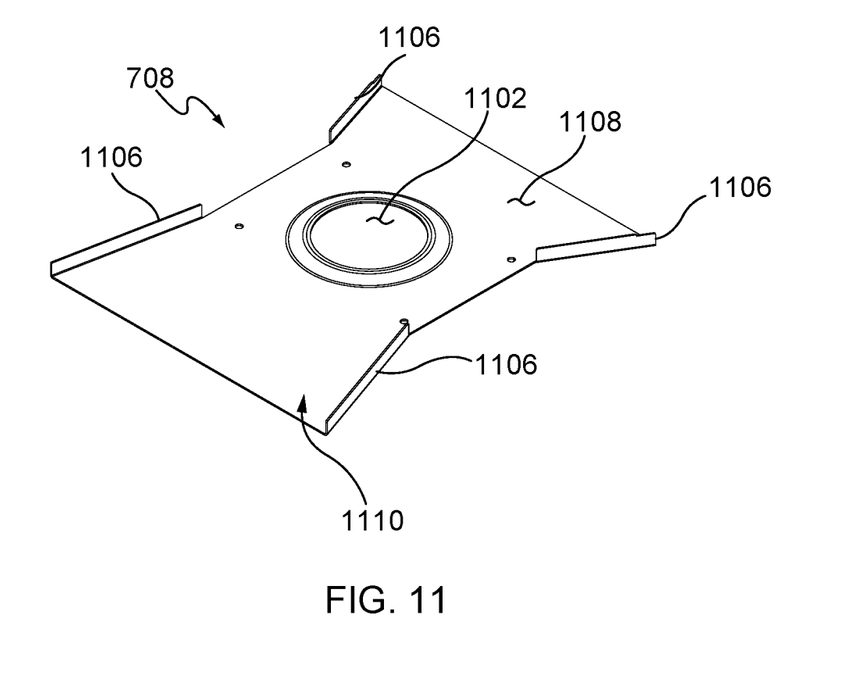
FIG. 11 illustrates a perspective view of an air plenum piece of the cooling apparatus of FIG. 7.

FIG. 11 provides a perspective view of the air plenum piece 708. The air plenum piece includes a plenum planar portion 1108, vertical tabs 1106, and an air plenum hole 1102 located on plenum planar portion 1108. The air plenum piece 708 is configured to form a channel 1110 and direct the flow of air in a manner similar to that described regarding the air plenum piece 106.

The plenum planar portion 1108 of the air plenum piece 708, however, has a narrower width in the region that overlies the heat sink 706 to permit the vertical walls 1006 of the heat sink 706 to extend upward above the air plenum piece 708 and allow the raised horizontal portions 1008 of the heat sink 706 to contact the upper housing when the cooling apparatus 700 is assembled. The vertical walls 1006 of the heat sink 706 are also configured to fit tightly against the edges of the planar portion 1108 and serve in place of the vertical tabs 1106 in that region of the air plenum piece 708. Thus, the combination of the vertical tabs 1106 and the vertical walls 1006 of the heat sink 706 substantially provide a single path for the intake air pulled in by fan 1002.

Figure 12:
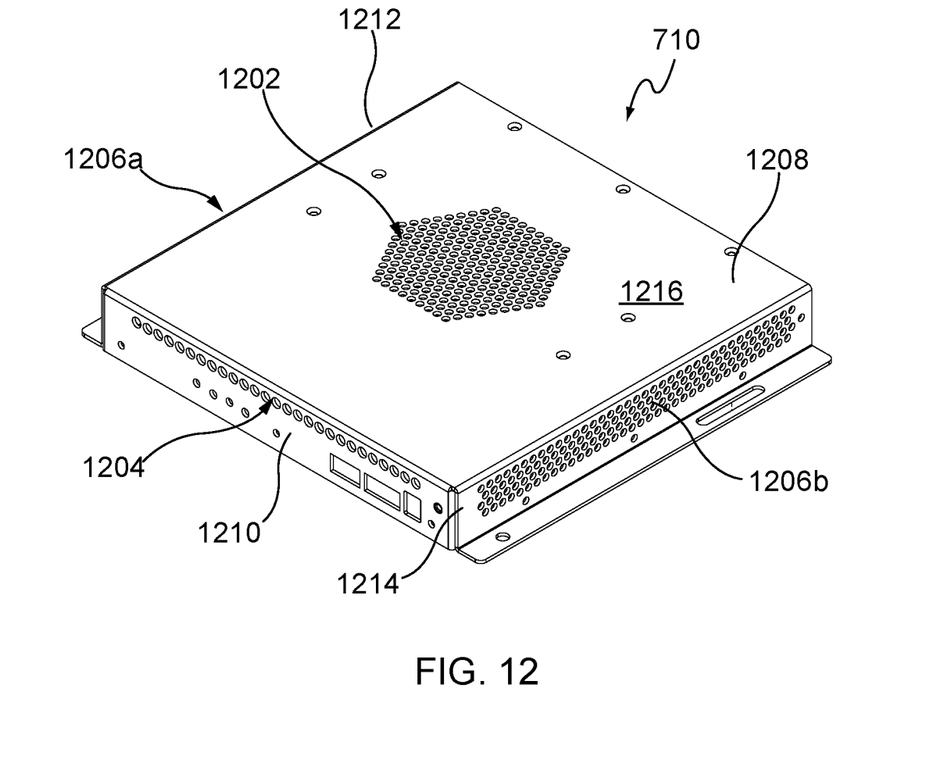
FIG. 12 illustrates a perspective view of an upper portion of the cooling apparatus of FIG. 7.

FIG. 12 depicts a perspective view of the upper portion 710 of the cooling apparatus 700. The upper portion includes a front panel 1210, a left side panel 1212, a right side panel 1214, and an upper panel 1216. The front panel 1210 includes a plurality of front air inlets 1204. The left side panel 1212 includes left side air exhaust openings 1206a, and the right side panel 1214 includes right side air exhaust openings 1206b. Further, the top portion 1216 includes a plurality of top air inlet openings 1202. The structure of the upper portion 710 is similar to that of the upper portion 108 shown in FIGS. 1-2 and 6.

According to aspects of the embodiments, when the fan 1002 operates, the circuitry is cooled by the cooling apparatus 700 in a manner similar to that carried out by the cooling apparatus 100. Namely, cooling intake air is drawn in through the top air inlet 1202, the front air inlet 1204, and the rear air inlet 802 by the fan 1002. As the intake air is drawn in, the intake air is directed along the top surface of the air plenum piece 708 and provides a single path for the intake air pulled in by fan 1002. That is, the air plenum piece 708, together with the vertical walls 1006 of the heat sink 706, substantially seals the upper portion of the interior of the housing from the lower portion (the volume below the air plenum piece 708), which includes the circuit board 704 and the upper surface of the lower portion 702. Further, since all of the air intake openings (802, 1202, 1204) are located in the space defined by the upper level of the air plenum piece 708 and the interior lower surface of upper portion 710, the intake air travels through the air channel 1110 to the hole 1102 via operation of the fan 1002.

The air drawn through the hole 1102 by the fan 1002 then passes over the pin array 1010 of the heat sink 706 and removes heat from the heat sink 706 and from the circuitry 904 located on the circuit board 704 that is in thermal contact with the lower horizontal portion 1004 of the heat sink. The warmed output air (output air) is then expelled through side air exhausts 1206a, 1206b.

Alternatively, according to aspects of the embodiments, when the fan 1002 does not operate, the cooling apparatus 700 is still able to remove heat from the circuitry because of the configuration of the heat sink 706 and the air plenum piece 708. Namely, the vertical walls 1006 of the heat sink 706, which extend upward from the lower horizontal portion 1004 of the heat sink and past the narrower region of the air plenum piece 708, and the upper horizontal portions 1008 of the heat sink, which contact the upper panel 1216 of the upper portion 710, provide an alternative path for heat conduction. The vertical walls 1006 and the upper horizontal portions 1008 of the heat sink 706 conduct heat away from the circuitry to the upper panel 1216 of the upper portion 710 where the heat circulates to the air that is external to the upper panel 1216.

Therefore, according to aspects of the embodiments, during full power operation of the circuitry, cooling of the circuitry is provided by operation of the fan 1004 to draw air through the housing in the manner described above. Thereafter, when power to the circuitry is removed or reduced, the fan 1004 is shut off and the cooling apparatus 700 continues to cool the circuitry by the heat sink 706 conducting heat to the upper panel 1216. As a result, heat is still removed from the circuitry without the generation of sound caused by operation of the fan 1004.

As discussed in regard to one or more of the Figures described herein, reference is made to several dimensions, including several radii, angles, height, among others. Those of skill in the art can appreciate that although examples of dimensions are provided, these should not be taken in a limiting manner; that is, the aspects of the embodiments are not to be construed as defined or limited by the specific example of the dimensions shown and discussed, but instead are provided merely for illustrating an example of what a device that incorporates the aspects of the embodiments could, in a non-limiting manner, look like. Furthermore, as those of skill in the art can appreciate, since the aspects of the embodiments are directed towards a physical object, with dimensional characteristics, all of the parts will have various dimensions, some of which are not shown in fulfillment of the dual purposes of clarity and brevity. According to still further aspects of the embodiments, some of these objects will have dimensional characteristics that lend themselves to aesthetic aspects; in fulfillment of the dual purposes of clarity and brevity, dimensions in this regard have also been omitted. Therefore, as the aspects of the embodiments are directed towards a cooling apparatus for use with cooling electronic circuitry, it is to be understood that the dimensions of the different objects, some dimensions shown, some dimensions not shown, will be understood by those of skill in the art.

The disclosed embodiments provide systems, methods, and modes for cooling of circuitry located within rack mounted equipment housings. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

INDUSTRIAL APPLICABILITY

To solve the aforementioned problems, the aspects of the embodiments are directed towards systems, methods, and modes for cooling of circuitry located within rack mounted equipment housings that substantially eliminates or prevents problems associated with currently available technology.

Alternate Embodiments

Alternate embodiments may be devised without departing from the spirit or the scope of the embodiments.

What is claimed is:

1. An apparatus for cooling electronic circuitry the apparatus comprising:
    an enclosure configured to surround the electronic circuitry, the enclosure including a plurality of panels, wherein
        a plurality of air intake holes are disposed in at least one of the plurality of panels and open to at least one first direction, and
        a plurality of air exhaust holes are disposed in at least another one of the plurality of panels and open to at least one second direction that is a different direction than the at least one first direction;
    a heat sink configured to be in thermal contact with the electronic circuitry and conduct heat generated by the electronic circuitry;
    a fan arranged such that when the fan operates, cooling air is drawn from an exterior of the enclosure along the at least one first direction through the plurality of air intake holes, absorbs heat from the heat sink, and then is directed through the plurality of air exhaust holes into the exterior of the enclosure along the at least one second direction;
    the heat sink being further configured to be in thermal contact with the enclosure so that when the fan does not operate heat is still drawn from the electronic circuit to the enclosure via the heat sink and is dissipated from the exterior of the enclosure; and
    an air plenum piece that includes a substantially planar portion disposed within the enclosure,
        the substantially planar portion being configured to divide an interior region of the enclosure into a first volume into which the plurality of air intake holes open and a second volume into which the plurality of air exhaust holes open, and the substantially planar portion having an air plenum hole that forms an opening between the first volume and the second volume, wherein the substantially planar portion of the air plenum piece further comprises a region having a smaller width than at least another region of the substantially planar portion.

2. The apparatus of claim 1, wherein the air plenum hole is formed in the region having the smaller width.

3. The apparatus of claim 2, wherein the at least another region of the substantially planar portion has a width that increases with increasing distance from the air plenum hole.

4. An apparatus for cooling electronic circuitry the apparatus comprising:

an enclosure configured to surround the electronic circuitry the enclosure having a plurality of panels, wherein a plurality of air intake holes are disposed in at least one of the plurality of panels, and a plurality of air exhaust holes are disposed in at least another one of the plurality of panels;

an air plenum piece disposed within the enclosure and including a substantially planar portion configured to divide an interior region of the enclosure into a first volume into which the plurality of air intake holes open and a second volume into which the plurality of air exhaust holes open, the air plenum piece having an air plenum hole that forms an opening between the first volume and the second volume:

a heat sink configured to be in thermal contact with the electronic circuitry and conduct heat generated by the electronic circuitry: and a fan located in coaxial alignment with the air plenum hole such that when the fan operates, cooling air is drawn from an exterior of the enclosure through the plurality of air intake holes into the first volume, then through the air plenum hole into the second volume, and thereafter from the second volume through the plurality of air exhaust holes into the exterior of the enclosure, the movement of the cooling air drawing the heat away from the heat sink; and the heat sink being further configured to be in thermal contact with the enclosure so that when the fan does not operate, heat is still drawn from the electronic circuitry to the enclosure via the heat sink and is dissipated from the exterior of the enclosure, wherein the substantially planar portion of the air plenum piece further comprises a region having a smaller width than at least another region of the substantially planar portion.

5. The apparatus of claim 4, wherein the heat sink comprises a lower portion that is disposed in the second volume, the lower portion having a surface that is in thermal contact with the electronic circuitry, at least one vertical portion that, at one end thereof, extends from the lower portion of the heat sink, and then alongside at least one edge of the region of the air plenum piece having the smaller width, and at least one upper portion that extends from another end of the at least one vertical portion, the at least one upper portion being in thermal contact with the enclosure so that when the fan does not operate, heat is drawn from the electronic circuitry via the lower portion of the heat sink, then via the at least one vertical portion of the heat sink, and then via the at least one upper portion of the heat sink to the enclosure, whereby the heat is dissipated into the exterior of the enclosure.

6. An apparatus for cooling electronic circuitry, the apparatus comprising:

an enclosure configured to surround the electronic circuitry, the enclosure having a plurality of panels, wherein a plurality of air intake holes are disposed in at least one of the plurality of panels, and a plurality of air exhaust holes are disposed in at least another one of the plurality of panels;

an air plenum piece disposed within the enclosure and including a substantially planar portion configured to divide an interior region of the enclosure into a first volume into which the plurality of air intake holes open and a second volume into which the plurality of air exhaust holes open, the substantially planar portion including a region having a smaller width than at least another region of the substantially planar portion, the air plenum piece having an air plenum hole disposed in the region having the smaller width and that forms an opening between the first volume and the second volume, the at least another region having a width that increases with increasing distance from the air plenum hole, and one or more wall portions extending away from the substantially planar portion;

a heat sink configured to be in thermal contact with the electronic circuitry and conduct heat generated by the electronic circuitry; and a fan located in coaxial alignment with the air plenum hole such that when the fan operates, cooling air is drawn from an exterior of the enclosure through the plurality of air intake holes into the first volume, then through the air plenum hole into the second volume, and thereafter from the second volume through the plurality of air exhaust holes into the exterior of the enclosure, the movement of the cooling air drawing the heat away from the heat sink; and the heat sink being further configured to be in thermal contact with the enclosure so that when the fan does not operate, heat is still drawn from the electronic circuitry to the enclosure via the heat sink and is dissipated from the exterior of the enclosure.

7. The apparatus of claim 6, wherein the heat sink comprises a lower portion that is disposed in the second volume, the lower portion having a surface that is in thermal contact with the electronic circuitry, a first vertical portion that, at one end thereof, extends from a first edge of the lower portion of the heat sink, and then alongside a first edge of the region of the air plenum piece having the smaller width;

a first upper portion that extends from another end of the first vertical portion, a second vertical portion that, at one end thereof, extends from an opposing edge of the lower portion of the heat sink, and alongside a second edge of the region of the air plenum piece having the smaller width, and a second upper portion that extends from another end of the second vertical portion, the first upper and second upper portions are each in thermal contact with the enclosure so that when the fan does not operate, heat is drawn from the electronic circuitry via the lower portion of the heat sink, then via the first and second vertical portions of the heat sink, and then via the first and second upper portions of the heat sink to the enclosure, whereby the heat is dissipated into the exterior of the enclosure.

8. The apparatus of claim 6, wherein
the plurality of panels further comprises
- a first panel configured to support a circuit board having the electronic circuitry,
- a second panel disposed opposite the first panel, wherein
    - the one or more wall portions of the air plenum piece extend from the substantially planar portion to the second panel,
- a plurality of further panels extending from the first panel to the second panel, wherein
    - the plurality of air intake holes are disposed in at least the second panel, and
    - the plurality of air exhaust holes are disposed in at least one of the plurality of further panels; and the heat sink comprises
- a lower portion that is disposed in the second volume, the lower portion having a surface that is in thermal contact with the electronic circuitry,
- a first vertical portion that, at one end thereof, extends from a first edge of the lower portion of the heat sink, and then alongside a first edge of the region of the air plenum piece having the smaller width;
- a first upper portion that extends away from another end of the first vertical portion,
- a second vertical portion that, at one end thereof, extends from an opposing edge of the lower portion of the heat sink, and alongside a second edge of the region of the air plenum piece having the smaller width, and
- a second upper portion that extends away from another end of the second vertical portion, the first upper and second upper portions are each in thermal contact with the second panel of the plurality of panels so that when the fan does not operate, heat is drawn from the electronic circuitry via the lower portion of the heat sink, the first and second vertical portions of the heat sink, and then the first and second upper portions of the heat sink to the second panel, whereby the heat is dissipated into the exterior of the enclosure.

* * * * *